(12) United States Patent
Sartorius et al.

(10) Patent No.: US 6,215,805 B1
(45) Date of Patent: Apr. 10, 2001

(54) Q-SWITCHED SEMICONDUCTOR LASER

(75) Inventors: Bernd Sartorius; Martin Moehrle, both of Berlin (DE)

(73) Assignee: Heinrich-Hertz-Institut fuer Nachrichtentechnik Berlin GmbH, Berlin (DE)

( * ) Notice: Subject to any disclaimer, the term of this patent is extended or adjusted under 35 U.S.C. 154(b) by 0 days.

(21) Appl. No.: 09/155,583
(22) PCT Filed: Mar. 27, 1997
(86) PCT No.: PCT/DE97/00696
§ 371 Date: Sep. 29, 1998
§ 102(e) Date: Sep. 29, 1998
(87) PCT Pub. No.: WO97/37406
PCT Pub. Date: Oct. 9, 1997

(30) Foreign Application Priority Data

Mar. 29, 1996 (DE) .............................................. 196 13 704

(51) Int. Cl.$^7$ ........................................................ H01S 5/00
(52) U.S. Cl. ................. 372/50; 372/50; 372/10; 372/92; 372/27; 372/20; 372/99; 372/44; 372/11
(58) Field of Search ................................ 372/50, 10, 20, 372/99, 92, 44, 97, 27, 11

(56) References Cited

U.S. PATENT DOCUMENTS

| | | | |
|---|---|---|---|
| 4,982,405 * | 1/1991 | Zayhowski et al. | 372/10 |
| 5,132,977 * | 7/1992 | Zayhowski et al. | 372/10 |
| 5,408,481 * | 4/1995 | Scheps | 372/22 |
| 5,461,637 * | 10/1995 | Mooradian et al. | 372/92 |
| 5,682,397 * | 10/1997 | Scheps | 372/22 |

* cited by examiner

Primary Examiner—Frank G. Font
Assistant Examiner—Delma R. Flores Ruiz
(74) Attorney, Agent, or Firm—Karl Hormann

(57) ABSTRACT

A Q-switched semiconductor laser is supposed to facilitate high-frequency laser modulation with low currents or voltage ranges. According to the invention, a laser of this type consists of at least one continually pumped active medium and two optically coupled resonators at least one of which is passive, both resonators having different mode combs corresponding to the Nonius principle, at least one resonator mirror taking the form of a reflector with strongly dispersive reflection characteristics in the laser wavelength range selected by the double resonator, the index of refraction of the passive resonator and/or reflector capable of being adjusted electronically. With this device, the reflectivity of the laser wavelength can be adjusted in such a way that, with a fixed effective amplification by electrical modulation of the reflectivity of the resonator reflector with strongly dispersive reflection characteristics, the laser threshold can be raised or lowered so as to switch the semiconductor laser on or off.

20 Claims, 6 Drawing Sheets

Q-SWITCHED SEMICONDUCTOR LASER

BACKGROUND OF THE INVENTION

1. Field of the Invention

The invention relates to a Q-switched semiconductor laser consisting of at least two electrically separated but optically coupled resonators of which one is structured as a passive resonator and the other one is structured as an active resonator.

Since short and intensive laser pulses can be generated with such arrangements, Q-switched semiconductor lasers are used, among others, in the field of non-linear optics and communication/optical data transmission.

In a Q-switched laser, a high population inversion is built up by strong pumping, and leads to a high amplification. But high resonator losses initially prevent their lasing activity. Once the losses are overcome, a short light pulse of high impulse intensity will be emitted. One way of accomplishing Q-switching is to alter the external losses at the resonator reflectors; another way is initially to produce internal losses in the resonator which losses may subsequently be eliminated.

2. The Prior Art

In IEEE Photonics Technology Letters, Vol. 7, No. 10, October 1995, pp. 1125–1127, there is described a dual-section DFB laser one section of which is initially operated as an absorber and which is thereafter made transparent by current injection. To this end, the net amplification in the resonator is modulated. Compared to laser modulation by pumping current, this arrangement yields improvements in respect of modulation currents and in the chirp. Yet high frequency laser modulation with low currents or voltage ranges have thus far not been realized.

U.S. Pat. No. 4,982,405 describes a Q-switched laser having two optically coupled resonators. As there described, Q-modulation is accomplished by detuning the two resonators.

The state of the art upon which the invention is based is described in IEEE Journal of Quantum Electronics 30 (1994), May, No. 5, pp. 1204–1211. The described Q-switched semiconductor laser consists of two optically coupled resonators one of which is structured as a passive resonator and the other of which is structured as an active resonator. Both resonators may be electrically switched (electrodes on the reflectors, common center electrode for both reflectors), whereby pumping of the active section (causing amplification) and tuning of the refractive index of the passive section may be carried out in separate operations. In this solution, too, the power modulation referred to as Q-modulation is accomplished by detuning of the two resonators. In this arrangement, the range having a variable refractive index, together with the two Bragg reflectors embracing this range, acts as a variable reflector or as a tunable etalon. DBR reflectors are used as resonator reflectors because of their high and substantially constant reflectivity within the stop band. In this arrangement, the DBR structure at the laser wavelength acts exclusively as a highly reflective mirror. While these solutions known from the state of the art permit high-frequency Q-modulation of the lasers, they do so at a low modulation range.

OBJECT OF THE INVENTION

It is, therefore, the object of the invention to provide a Q-switched laser which makes high frequency laser modulation possible at low currents or voltage ranges, as the case may be.

BRIEF SUMMARY OF PREFERRED EMBODIMENTS

The object is accomplished by the fact that in a Q-switched semiconductor laser of the kind referred to above the two optically coupled resonators for laser mode selection are provided with differently structured mode combs which overlap spectrally such that at least one defined laser wavelength is selected, that at least one resonator reflector of the two optically coupled resonators is structured as a reflector with a strongly dispersive reflection characteristic in the range of the wavelength selected by the two optically coupled resonators, that means is provided for electrically or optically tuning the refractive index of the dispersive reflector and/or of the passive resonator so that spectral control of the laser mode is accomplished relative to the dispersive reflector.

With this arrangement, the reflectivity for the laser wavelength may be set such that at a constant effective amplification by electrical modulation of the reflectivity of the strongly dispersive resonator mirror, the lasing threshold may be lowered or raised such that the semiconductor laser may thereby by switched on or off.

A similar arrangement has previously been described in IEEE Photonics Technology Letters, Vol. 8, No. 1, January 1990, pp. 28–20. That multi-section laser is, however, operated in a different manner and serves a function different from the one of the present solution. Thus, in that self-pulsating multi-section laser, the active layer is pumped so strongly, i.e., it is switched at so high a current, that the active resonator is activated as a laser on its own. In contradistinction to the operation of the laser in accordance with the invention, the currents in the passive resonator and in the reflector are fixed at such values that noise of the charge carrier density in the active resonator which, in turn, leads to noise in of the laser wavelength, is stepped up by the wavelength dependent feedback from the reflector such that oscillations of laser power, wavelength and charge carrier density occur in the laser section.

In respect of the function of the Q-switched semiconductor laser in accordance with the invention, the presence of two optically coupled resonators having two mode combs which spectrally overlap such that a defined laser wavelength is selected—similar to the Nonius principle known from mechanics—is critical for the reason that laser emission would, because of the many possible modes in a simple semiconductor laser, not otherwise be supported by the desired mode. Instead, competing modes yielding higher and non-dispersive reflection would dominate the laser activity.

To structure one of the resonators as a passive resonator is important because its refractive index may be unequivocally set or adjusted externally while in an active resonator charge carrier density and, hence, refractive index and wavelength are additionally dependent upon the photon density. All in all, therefore, a laser mode is selected by the dual resonator, and the wavelength is substantially fixed by the passive resonator. This wavelength is, however, adjustable within a certain wavelength range by electrically switching of the passive resonator. A substantially spectral match of the wavelength with the strong dispersion in the reflector characteristic may be realized during fabrication. Fine tuning is accomplished by electrical offset when switching the passive resonator or reflector.

The actual modulation is then carried out by electrical switching (applied electrical field or charge carrier injection) of the refractive index of the passive resonator or by electrical switching of the reflector. The laser threshold may be very efficiently modulated, and the laser may thus be switched on and off without modulating the net amplification, even by very small changes of the spectral correlation of laser wavelength relative to the spectrally steep reflection flank of the reflector.

High frequency modulations are possible with the arrangement in accordance with the invention since the control signals require small ranges only. By comparison to the power modulation by laser current modulation a much small chirp (wavelength modulation) is obtained as the charge carrier density in the active resonator requires no modulation and since, moreover, the wavelength is fixed by the passive resonator.

Further advantageous and useful details of the invention are set forth in the subclaims. Among these are, in particular, the structure of the resonator mirrors and of the two optically coupled resonators.

This embodiments provide for structuring the strongly reflective resonator as a DFB or DBR grid which may be tuned relative to the refractive index, are as a narrow band interference filter on a laser facet.

In further embodiments, the reflector is provided with super grid structures. Such super grid structures which may be realized for instance by phase leaps or by varying the Bragg wavelength or the coupling coefficient, make it possible to modify the reflection characteristic of the homogenous DFB or DBR grids. Hence, the preconditions for realizing desired transfer functions/switching characteristics may be technologically set during the fabrication process in dependence of the grid structure and, therefore, by the type of the reflection characteristic. Thus, for the linear modulation the reflector is provided with a super grid which realizes a linear ascent along the steep flank of the stop band edge of the reflection characteristic, and for digital switching it is provided with a supergrid suitable for ensuring a stepped path along the mentioned flank.

In one embodiment related to the resonators, one resonator is formed as an active laser section with a DFB grid arranged over the continually pumped optical medium, and the second resonator is arranged as a passive section between the active laser section and the dispersive reflector.

In another related embodiment, the above-mentioned active laser section is provided between the second resonator formed as a passive section and the dispersive reflector.

As mentioned before, the Nonius principle in accordance with which the two optically coupled resonators are provided with appropriate mode combs, ensures that oscillation of an undesired mode is suppressed. A further improvement may be attained by the DFB grid provided in the active laser section resonator having a Bragg wavelength which is displaced by about one stop band width, either by a shorter or by a longer wave.

In a further embodiment, the active and the passive resonator are separated from each other by a reflective interface, and the two resonators are limited by two reflectors. If the arrangement in accordance with the invention is provided with only one dispersively reflective resonator, the other reflector will be a reflecting facet.

The optimum spectral laser-reflector correlation may be set independently of the electric operating conditions if in addition to its electric activation at least one section is provided with a selectively operable heater, as provided in another embodiment. An additional heater leads to a changed refractive index in the heated section. Moreover, technological tolerances may be compensated with such an additional heater.

Furthermore, the passive resonator is provided with a laser-like hetero structure which, at the wavelength of laser emission, is set as transparent by current injection. Energetically, above the bandwidth such a laser-like hetero structure has a transparency point at lower wavelengths. To this end, it is necessary electrically to pump the hetero structure in such a manner that change-over from light absorption to light amplification takes place at the wavelength of interest. In this manner, it is possible to activate the passive resonator with wavelengths which are clearly lower than the laser wavelength. This would cause light to be absorbed. Alternatively, it could be activated with wavelengths which within the amplification spectrum are greater than the laser wavelength. This would dissipate charge carriers. Optical switching in two different directions is thus made possible by activation at different wavelengths.

For high frequency electrical activation of the semiconductor laser, the passive resonator is structured as a spacer from two sections which are separately electrically energizable. Since there are two separately energizable sections the requisite operating point is realized by one section (constant current), and the pure HF modulation is realized by the other section. Thus, it is not necessary to superimpose a constant value on the HF modulation. Electronically superimposing HF control signals and constant currents or voltages can, therefore, be avoided.

For realizing logical operations, for instance, for the logical combining of two signals, the sections of the semiconductor laser have to be selectively controllable, either electrically or optically. To this end, the semiconductor laser in accordance with the invention is set such that it can be digitally switched on or off only if two differing sections are activated simultaneously. The embodiments described hereinafter satisfy these requirements. Thus, the individual sections a selectively actuated by different high frequency electric signals. Furthermore, within the plane of the layers of the semiconductor structure there may be placed abutting a section of the semiconductor laser, transverse to the laser axis, a waveguide section for selectively coupling optical signals into this sections. It is also possible selectively to feed optical signals into an electrical contact which is provided with an optical window or which is structured semitransparently.

The invention is not limited to the previously described structures; rather, it embraces all variants incorporating the spirit of the invention.

DESCRIPTION OF THE SEVERAL DRAWINGS

Embodiments of the invention will hereafter be described in greater detail with reference to the drawings, in which:

FIG. 1 schematically depicts the structure of a Q-switched semiconductor laser in accordance with the invention, consisting of a passive and an active resonator and a dispersive reflector, in which the passive resonator is arranged between reflector and active resonator;

DESCRIPTION OF PREFERRED EMBODIMENTS

Figure 1:
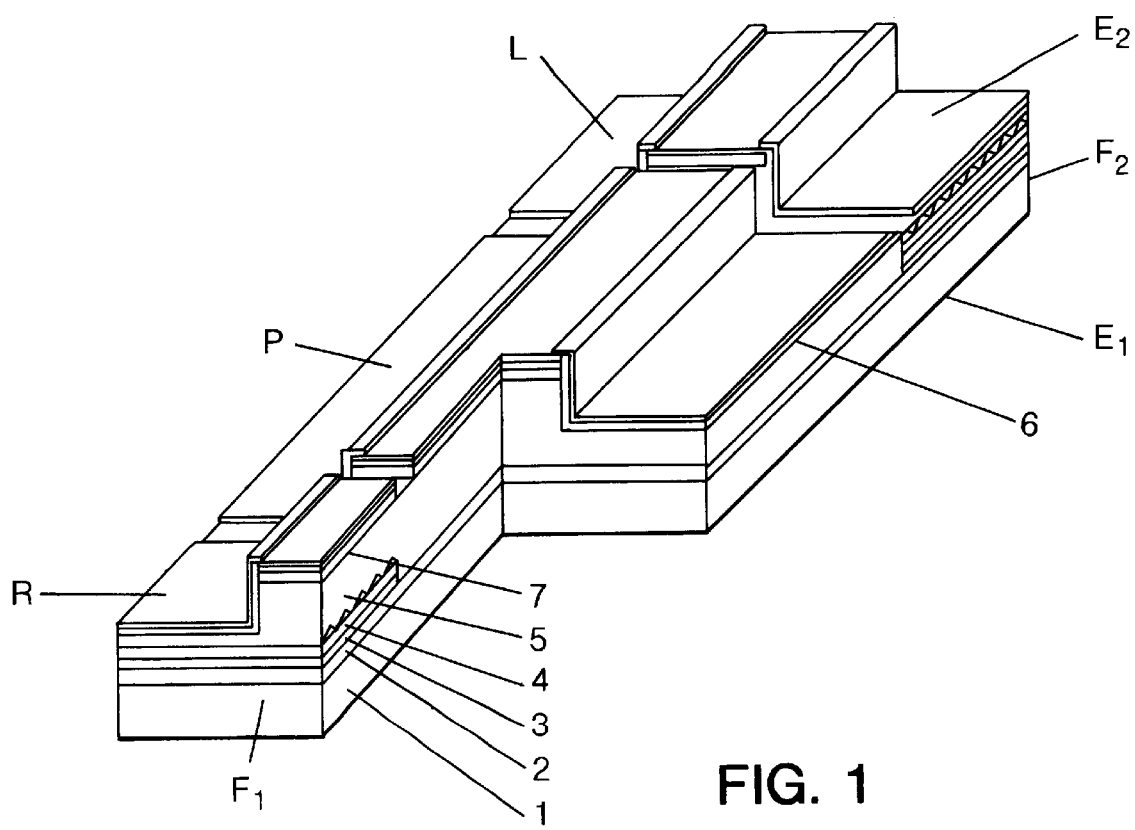

In FIG. 1, there is shown, as a rib waveguide structure, a Q-switched semiconductor laser consisting of an active resonator structured as a laser section L including a DFB grid, a passive resonator P and a reflector R also structured as a DFB grid and having a strongly dispersive reflection characteristic in the range of the laser wavelength selected by the dual resonator.

A 1.55 µm InGaAsP layer is arranged as active layer 3 having thickness of 150 nm on an n-InP substrate 1, between an n-1.3 µm InGaAsP waveguide layer 2 of a thickness of 300 nm and a p-1.18 µm InGaAsP waveguide layer 4 of 150 nm thickness. The DFB grid was inscribed by electron beam lithography and etched into the p-waveguide 4. Superimposed thereon are a p-InP layer 5 and an insulating $SiN_x$ layer 6 open only at the rib and covered by an electrode layer $E_2$. For reducing the transitional resistance, the center strip of the rib waveguide structure is also provided with a p-lnGaAs layer 7 of 400 nm thickness. The length of the laser section L is 300 nm, the thickness of the passive resonator section P is 400 nm, and of the dispersive reflector it is 200 nm. The substrate 1 is arranged on a base electrode $E_1$. The reflector R and the active resonator L are each limited by an anti-reflection coated facet $F_1$, $F_2$.

Figure 2:
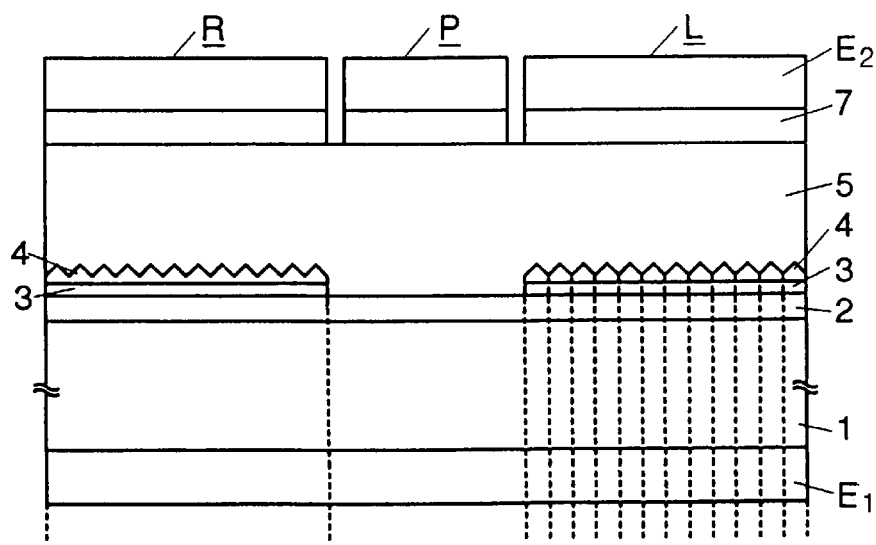
FIG. 2 is a cross-section through the Q-switched semiconductor laser depicted in FIG. 1.

The same Q-switched semiconductor laser in which the passive resonator section P, is arranged between the active resonator L and the reflector R, is shown in cross-section in FIG. 2. The section goes through the raise center strip of the rib waveguide structure. The similar layer structure of the two resonators L and P and of the dispersive reflector R may clearly be seen. The layer structure consists of the following layers: a base electrode $E_1$, an n-lnP substrate 1, an n-InGaAsP waveguide layer 2, an active InGaAsP layer 3, a p-InGaAs waveguide layer 4 including DFB grid, a p-InP layer 5 and a divided top electrode $E_2$ for separately activating the two resonators L and P and the reflector R, and a p-InGaAs layer 7 below the top electrode $E_2$.

Figure 3:
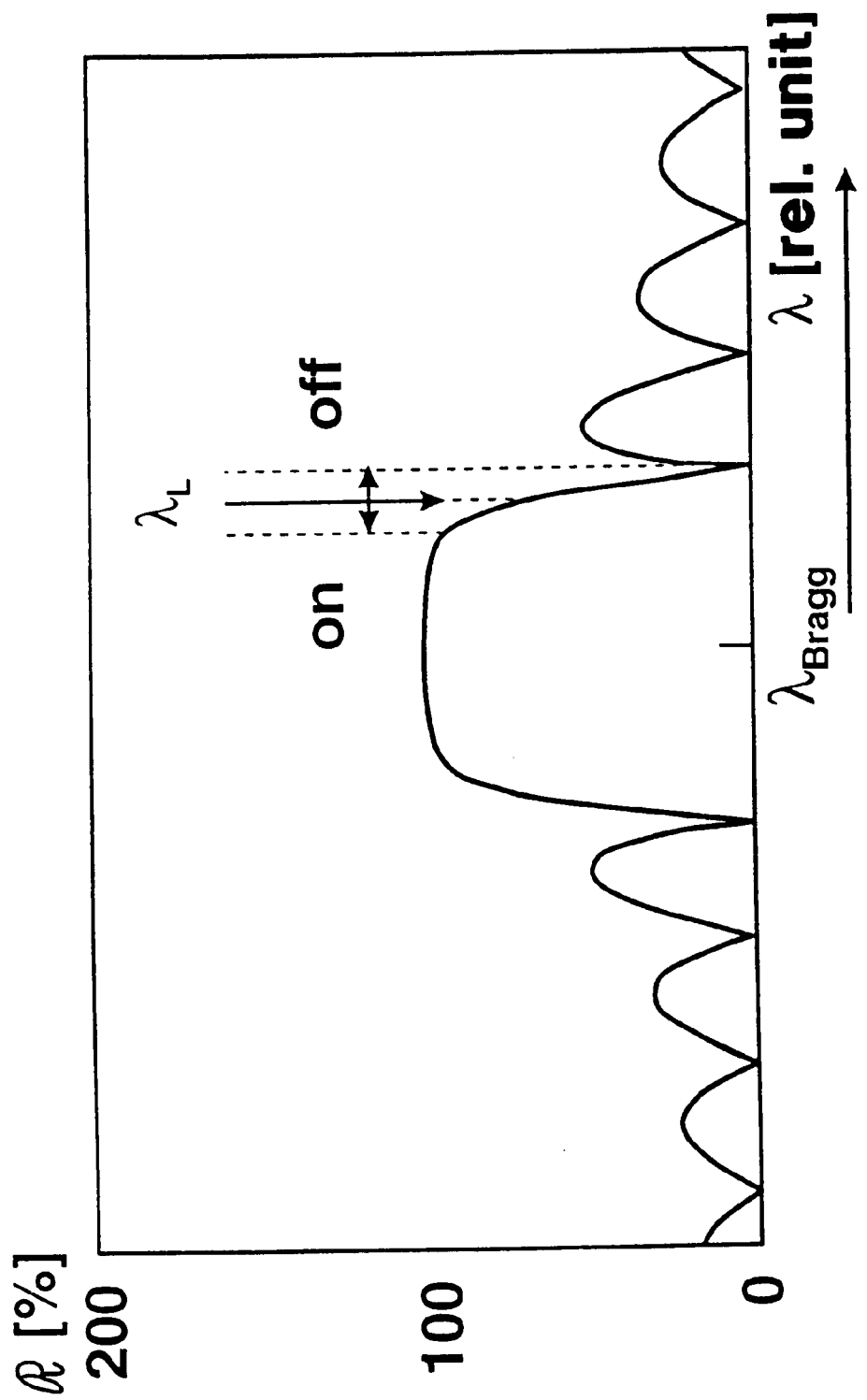
FIG. 3 shows the dependency of the reflectivity of the reflector from the wavelength.

FIG. 3 shows the dependency of the reflectivity ℜ of the reflector R from the wavelength λ while operating close to the transparency current density. Interfering competing laser wavelengths are faded out for the laser modes by the two different resonator conditions of the laser section L and the passive resonator P, similar to the Nonius principle of mechanical measuring techniques, the wavelength being fixed by a passive phase condition. The Q-switched semiconductor laser may thus be modulated in its power by the continual pumping current. The modulation is carried out by electrical variation of the passive resonator conditions or of the spectral resonator state. As may be seen in FIG. 3, the dispersive reflector R may be electrically switched into and out of the beam path of the Q-switched semiconductor laser by but a small change in the spectral state and at a fixed laser wavelength $λ_L$, the fixed laser wavelength having during fabrication previously been brought into approximate spectral correlation with the strong dispersion in the reflective characteristic, preferably in the range of the steep flank. As a consequence the laser threshold is modulated very efficiently, i.e. by very small current variations of voltage ranges.

Figure 4:
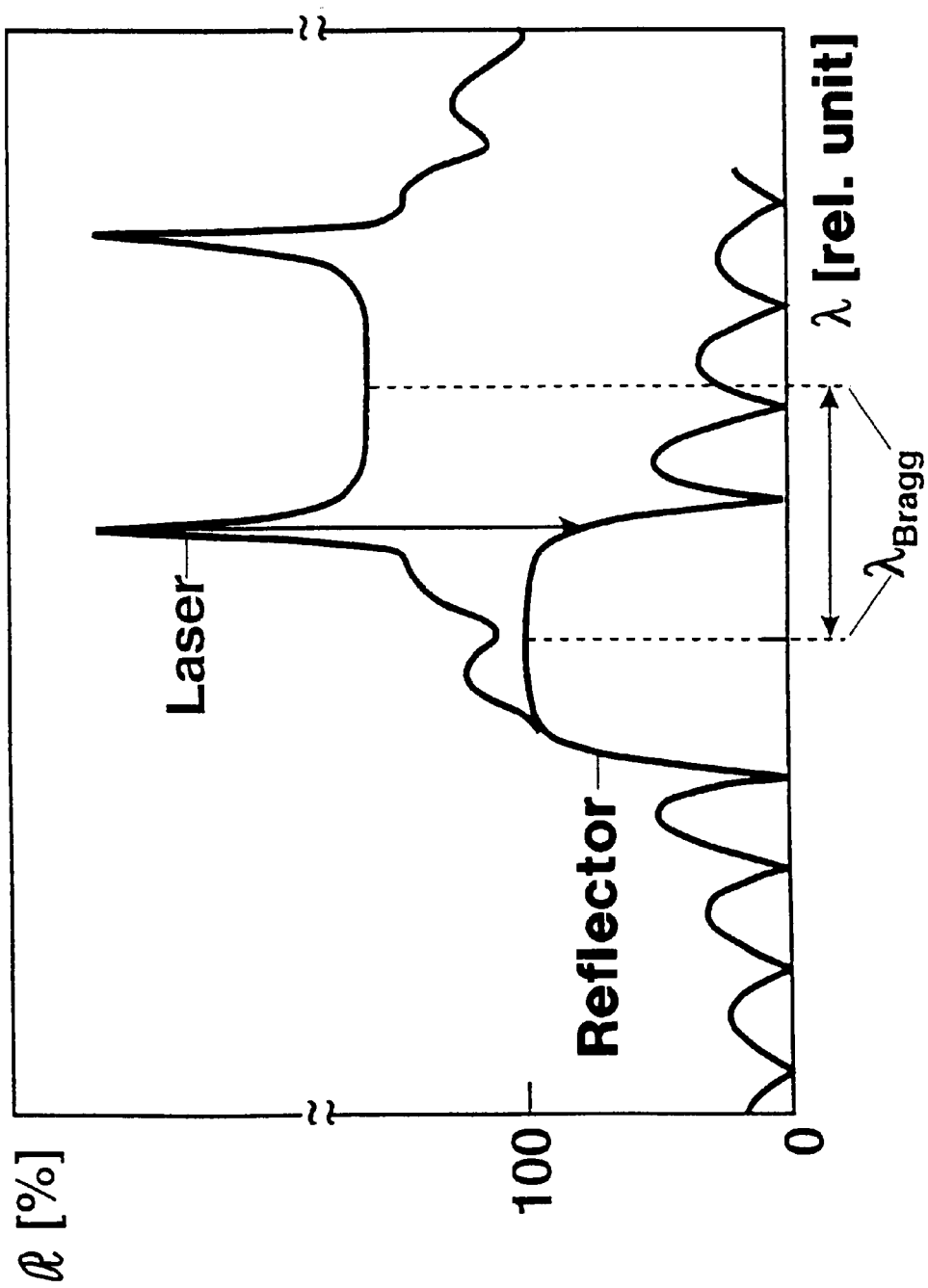
FIG. 4 depicts the spectral characteristic of a DFB laser with the shift of the two Bragg wavelengths relative to each other, in addition to the wavelength-dependent reflectivity of the reflector depicted in FIG. 3.

FIG. 4 again shows the dependency of the reflectivity ℜ of the reflector R from the wavelength λ and, in addition, as compared to FIG. 3, the spectral characteristic of a DFB laser. DFB lasers have two almost equal modes in the short and long waves relative to the stop band. It is necessary for the dispersive Q-modulation to suppress the start of any oscillation of an undesired mode which is accomplished by selecting a defined laser wavelength—similar to the Nonius principle of mechanical measuring techniques already mentioned—between DFB modes and passive resonator modes. Improved suppression of the undesired mode is obtained if the Bragg wavelengths are displaced from the DFB laser and DFB or DBR reflector by about one stop band width, as has been shown in FIG. 4. The shortwave laser mode will then correlate with the drop in reflectivity on the long wave side of the reflector stop band while there is no spectral overlap between the long wave laser mode and the high reflectivity in the stop band so that it can hardly oscillate into laser action.

Figure 5A:
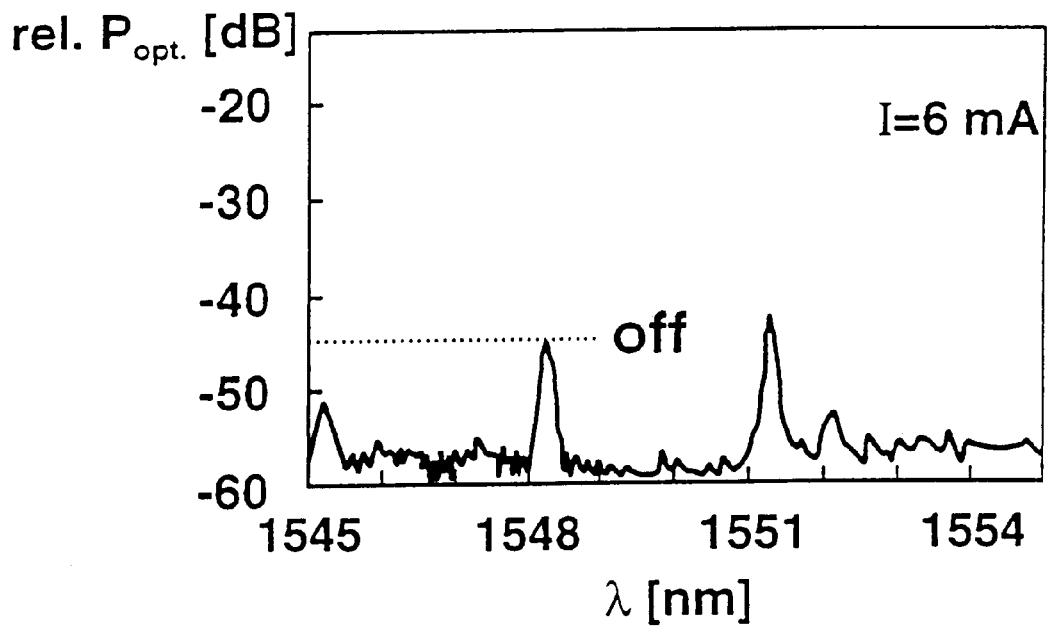
FIG. 5 shows optical spectra of the laser depicted in FIGS. 1 and 2 when the passive resonator is controlled with different currents.
Figure 5B:
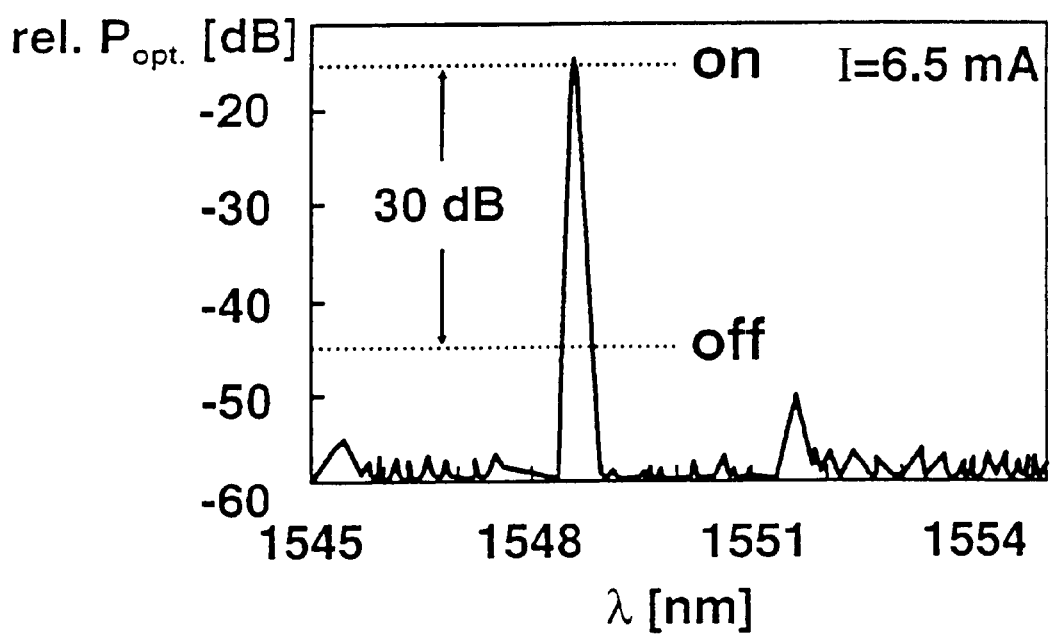
Figure 6:
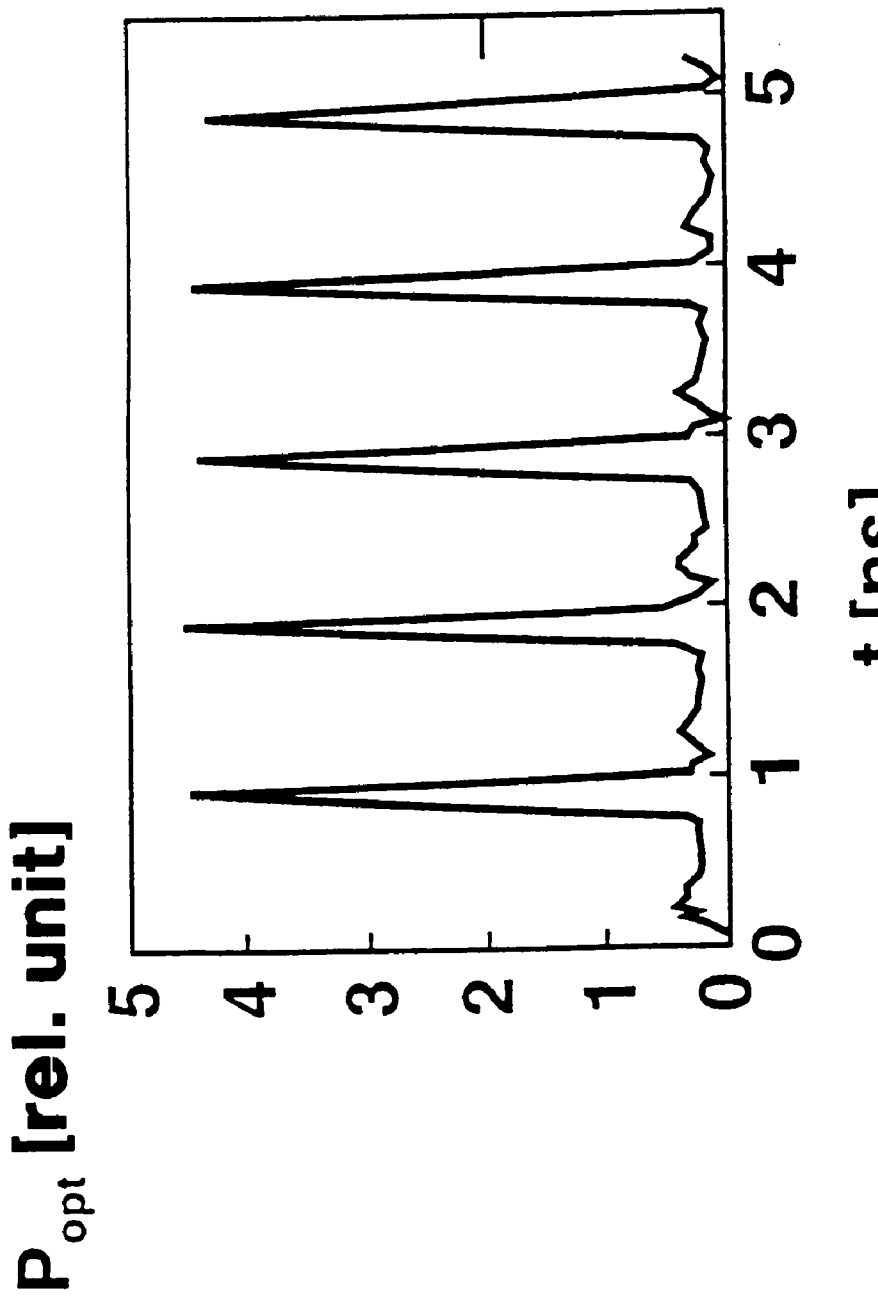
FIG. 6 depicts the dependency of the optical power on time when the passive resonator of the laser depicted in FIGS. 1 and 2 is controlled by a sinusoidal current modulated at 1 GHz.

FIG. 5 depicts the relative optical power $P_{opt}$ as a function of the wavelength λ at different currents with which the passive resonator P was fed, of a Q-switched semiconductor laser in accordance with the invention and having the structure of FIG. 1 or 2, as the case may be. The laser section L with the DFB grid is driven at so low a current —41 mA in this instance—that the laser can commence to oscillate only by connecting or switching on an additional reflectivity. The dispersive reflector R with DFB grid is controlled at 16 mA. If the passive resonator P is then operated at different currents I (in this instance 6 mA and 6.5 mA) switching on and off of the semiconductor laser in accordance with the invention may be observed. At a current of 6.5 mA one may observe a mono-mode emission at a wavelength λ=1,548 nm; if the current I is reduced by 0.5 mA to 6 mA, the laser will be switched off. This will yield a switch contrast greater than 30 dB. Since the currents and, hence, the amplification of the laser section L and of the reflector R are fixed, these curves prove of the dispersive threshold behavior of the Q-switched semiconductor laser, for, at a continual pumping current, the laser is switched on and off only by small changes (0.5 mA) of the current with which the passive resonator P is fed.

If the current I with which the passive resonator P is fed, is sinusoidally modulated at 1 GHz, a pulse train (optical power $P_{opt}$ as a function of time t) as shown in FIG. 5 is generated. Since the arrangement described above was not optimized for HF operations higher modulation frequencies are very likely possible as well.

Figure 7:
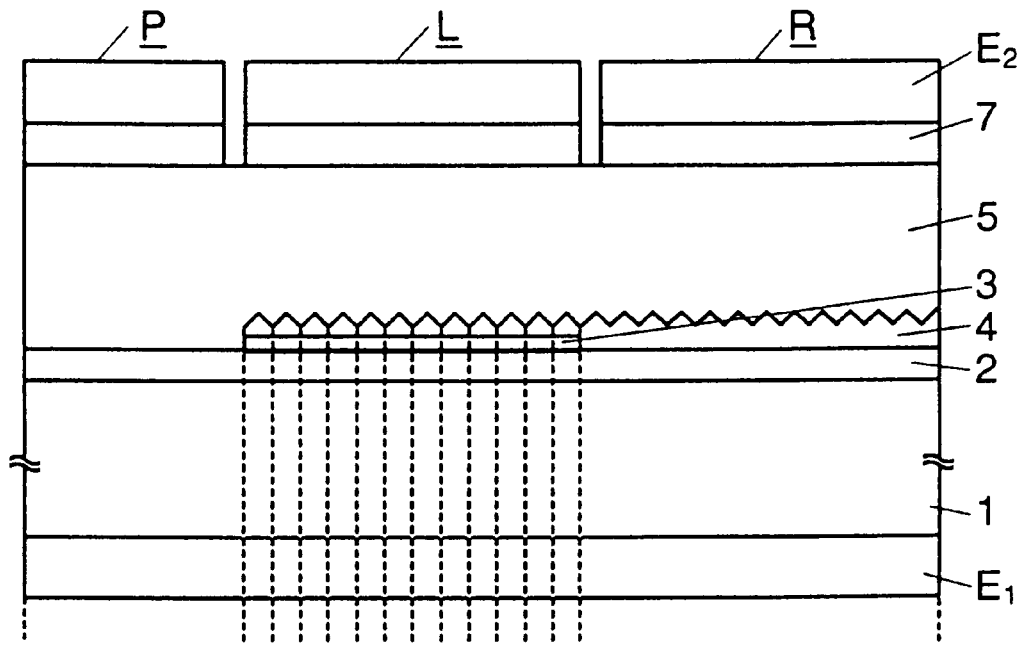
FIG. 7 depicts a cross-section through a Q-switched semiconductor laser in wihich the active resonator is arranged between the passive resonator and the dispersive reflector.
Figure 8:
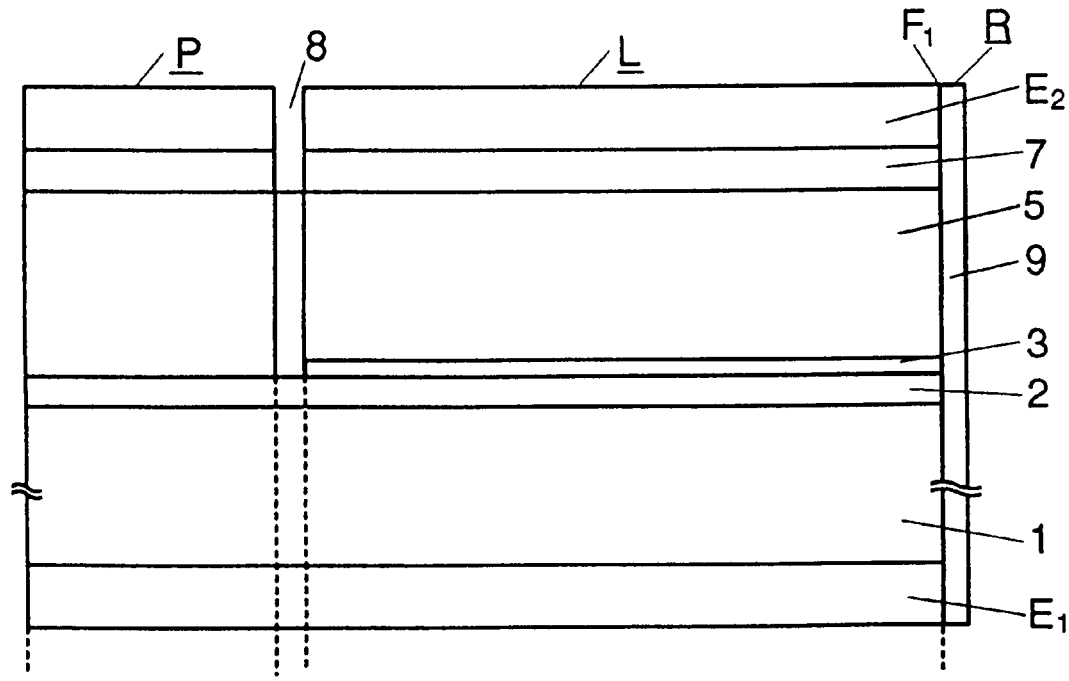
FIG. 8 shows a crossection through a Q-switched semiconductor laser in which the active and the passive resonators are separated from each other by a reflective interface.

FIGS. 7 and 8 depict further embodiments of the Q-switched semiconductor laser in cross-section.

In FIG. 7, the active resonator L of the laser section with the DFB grid is arranged between the passive resonator P and a reflector R structured as a DBR grid. The layer structure I the same as the one described in connection with FIG. 2.

FIG. 8 depicts an active resonator L structured as a Fabry-Perot laser L which is separated from the passive resonator P by a schematically shown reflective butt joint 8. The butt joint 8 may, for instance, be an etched trough having a width in the pm range and which for establishing a reflective surface in the direction of the resonator has one flank disposed vertically to the laser beam and one which is disposed obliquely thereto. On a laser facet—in this instance $F_1$—there is provided an interference filter 9. The other facet, not shown, is structured to be reflective.

The vertical dashed lines in FIGS. 2, 7 and 8 are intended to explain the effect of a "distributed" reflector in accordance with the solution provided by the invention.

For modulation, the Q-switched semiconductor laser in accordance with the invention requires only low currents or voltage ranges, for rather than a high laser current it is low control currents with a significant effect on the laser threshold which are being modulated. For this reason, it is particularly applicable for fast mode switching, i.e., it is not the laser which is switched on and off but, rather, relative to an active mode the threshold of another mode is lowered in such a manner that the selected mode will then start up and dominate.

The solution in accordance with the invention makes possible analog as well as digital control, since in dependency of the operating point and the type of control, laser power is changed either proportionally to the control parameter or abrupt digital switching may be obtained by hysteresis (holding function).

Instead of a control by electrical current it I also possible to achieve a change in the charge carrier densities by light injection into the semiconductor laser in accordance with the invention. The the transparency of a layer is always a function of the wavelength, "passive" resonators, too, may be triggered if a suitable wavelength is used which differs from the laser wavelength. Thus, waveguide layer 2 of the embodiments has a band edge of 1.3 µm. It, therefore, absorbs light of lower wavelengths than the active layer 3 which leads to the generation of charge carriers. With a DFB section used as a reflector, it is possible to achieve spectral separation of the DFB wavelength and the maximum amplification so that injected light of suitable wavelength is amplified while at the same time the charge carrier density is reduced. For the realization of this kind of optical switching it is advantageous that the semiconductor laser in accordance with the invention requires but low control power.

What is claimed is:

1. A Q-switched semiconductor laser, comprising:

a passive resonator;

an active resonator;

means for electrically separating the passive and active separators;

means for optically connecting the first and second resonators, said passive and active resonators having differently structured spectrally overlapping mode combs for laser mode selection at a predetermined wavelength;

means for structuring at least one of the passive and active resonators as a reflector with a strongly dispersive reflection characteristic in the range of the predetermined wavelength; and means for tuning the refractive index of at least one of the passive and active reflectors to control the laser mode relative to the dispersive reflector.

2. The laser of claim 1, wherein the active resonator comprises the dispersive reflector.

3. The laser of claim 1, wherein the means for tuning the refractive index comprises electrical means.

4. The laser of claim 1, wherein the means for tuning the refractive index comprises optical means.

5. The laser of claim 1, wherein a DFB grid is provided the dispersive reflector comprises an electrically tunable DFB grid.

6. The laser of claim 5, wherein the DFB grid comprises a supergrid structure.

7. The laser of claim 1, wherein the dispersive reflector comprises an electrically tunable DBR grid.

8. The laser of claim 7, wherein the DBR grid comprises a supergrid structure.

9. The laser of claim 1, wherein the dispersive reflector comprises a narrow band interference filter.

10. The laser of claim 1, wherein one resonator comprises an active laser section with a DFB grid arranged above an optically continually pumped medium and wherein the other resonator is arranged between the active laser section and the dispersive reflector.

11. The laser of claim 1, wherein one resonator comprises an active laser section with a DFB grid above an optically continually pumped medium and is arranged between the other resonator structured as a passive section and the dispersive reflector.

12. The laser of claim 5, wherein a DFB grid is provided in an active resonator and has a Bragg wavelength displaced by one stopband width relative to that of a DFB grid of a reflector.

13. The laser of claim 1, wherein the passive and active resonators are separated from each other by a reflective interface and wherein the resonators are limited by two reflectors.

14. The laser of claim 1, wherein the tuning means is additionally provided with means for heating at least one of the passive and active resonators.

15. The laser of claim 1, wherein the active resonator is of a laser-like structure which at the laser emission wavelength assumes a transparent state upon current injection.

16. The laser of claim 1, wherein the passive resonator is structured as a separators formed from two separately electrically controllable sections.

17. The laser of claim 16, wherein one of the electrically controllable sections is of a laser-like structure which at the laser emission wavelength assumes a transparent state upon current injection.

18. The laser of claim 16, wherein the two sections are adapted for selective control by different high-frequency electrical signals.

19. The laser of claim 1, comprising a laser plane including at least one waveguide structure abutting a section of the laser obliquely relative to the axis of the laser for selectively feeding optical signals into the section.

20. The laser of claim 19, further comprising an electrical contact in the section, the contact comprising an optical window for receiving the signals.

* * * * *